United States Patent [19]
Peterson et al.

[11] Patent Number: 5,920,190
[45] Date of Patent: Jul. 6, 1999

[54] SAMPLED CAPACITOR ELECTROMETER

[75] Inventors: Richard R. Peterson, Lompoc; Gibson M. Wolfe, Jr., Santa Barbara, both of Calif.

[73] Assignee: Delco Electronics Corp., Kokomo, Ind.

[21] Appl. No.: 08/531,995

[22] Filed: Sep. 21, 1995

[51] Int. Cl.⁶ .................................................. G01R 19/00
[52] U.S. Cl. .......................... 324/126; 324/131; 324/433
[58] Field of Search .................... 324/76.11, 72, 324/72.5, 98, 126, 131, 140 R, 426, 433

[56] References Cited

U.S. PATENT DOCUMENTS

| | | | |
|---|---|---|---|
| 3,766,335 | 10/1973 | Longstaff et al. | 324/76.11 |
| 4,085,298 | 4/1978 | Seidel | 324/126 |
| 4,866,389 | 9/1989 | Ryan et al. | 324/433 |

*Primary Examiner*—Michael Brock
*Attorney, Agent, or Firm*—Jimmy L. Funke

[57] ABSTRACT

An electrometer (20) for measuring an unknown DC potential finds particular utility in applications requiring a high input resistance and minimal current drain during measurement. The electrometer (20) employs a circuit containing a sampling diode (D1) and capacitor (C1). Prior to a measurement being taken, the capacitor (C1) is charged to a common-mode voltage and the diode (D1) is reverse biased to a potential approximating the unknown potential of the voltage source (30) to be measured. A switch (S1) is employed to momentarily cause current flow through the capacitor (C1) and to forward bias the diode (D1). The unknown potential is calculated from potentials associated with the sampling diode (D1) and the capacitor (C1). The calculation involves sampling the potential of the capacitor (C1) at precisely determined time delays.

12 Claims, 4 Drawing Sheets

SAMPLED CAPACITOR ELECTROMETER

BACKGROUND OF THE INVENTION

1. Technical Field

This invention relates to measuring devices and, more particularly, to an electrometer for measuring DC voltage potentials.

2. Discussion

Direct current voltage sources are used in a wide variety of different applications. In one application, electric vehicles include a battery pack with a plurality of batteries connected in series to power the electric vehicle. To ensure proper charging and maintenance of the batteries, each battery voltage is individually and accurately measured. Because the batteries are connected in series each battery floats at a different voltage relative to ground. Some batteries float at hundreds or even thousands of volts above ground potential. This known as the common mode potential ($V_{COMMON-MODE}$).

It is often difficult to obtain an accurate measurement of each individual battery's potential in the battery pack under circumstances where the battery to be measured is at a high common mode potential. Quite often it is necessary to utilize a sensing wire having a very large series resistance in such cases. Since the series resistance required is proportional to the square of the voltage, the resistance value of the series resistance increases very quickly with increasing $V_{COMMON-MODE}$ voltages. For example, if the current is to be limited to 4 milliamps when the $V_{COMMON-MODE}$ voltage is 250 volts, the series resistance must be at least 62.5 kohms.

In the past, electrometers for making such measurements have typically used electromechanical meter-type displays for displaying the measured voltage. it was also impractical to use such electrometers with microprocessors or other semiconductor devices without the use of isolation transformers to isolate the high $V_{COMMON-MODE}$ voltage from the semiconductor devices. The isolation transformers add cost, increase size and are vibrationally sensitive.

Therefore, a simple, durable, relatively inexpensive, accurate and compact electrometer which can be interfaced with semiconductor devices would be desirable.

SUMMARY OF THE INVENTION

In accordance with the teachings of the present invention, an electrometer is provided for measuring an unknown direct current (DC) potential of a voltage source. The electrometer finds particular utility for measuring batteries in an electrically powered device in which the electrometer must deal with very high common-mode voltage, very high source resistance, and utilize minimal current during the test, while maintaining a high level of accuracy.

In the inventive approach, a capacitive device is connected to the voltage source to be measured. Switch means are used to selectively apply a constant current source to the capacitive device when it is desired to measure the unknown potential of the voltage source. Sampling means are employed for sampling the potential associated with the capacitive device at least once at a predetermined time delay after the switch has applied the current. Processor means are used to generate an output related to the unknown potential of the voltage source as a function of the sample from the capacitive device.

BRIEF DESCRIPTION OF THE DRAWINGS

The various advantages of the present invention will become apparent to those skilled in the art after studying the following disclosure and by reference to the drawings in which.

DETAILED DESCRIPTION OF THE PREFERRED EMBODIMENTS

The operation of the broad concept of the present invention can be explained in connection with a simplified circuit 10 shown in FIG. 1. The simplified circuit 10 includes seven circuit components: a sampling diode D1, a resistor R1 charging a capacitor C1, a resistor R2 charging a capacitor C2, a switch S1, and a constant current source I1.

$V_{UNKNOWN}$ is the direct current (DC) voltage source whose potential is to be measured, and $V_{COMMON-MODE}$ is the common-mode voltage which biases the unknown voltage away from ground. Note that $V_{COMMON-MODE}$ may be of either polarity, i.e. raising the unknown above, or depressing it below ground potential. $V_{COMMON-MODE}$, however, must be connected with the polarity shown; that is, directing positive voltage towards a cathode of the sampling diode D1. Since the sampling diode D1 is reverse biased, the capacitor C1 is charged through the resistor R1 to approximately $V_{COMMON-MODE}$ and the capacitor C2 is charged through the resistor R2 to approximately $V_{COMMON-MODE}+V_{UNKNOWN}$.

Error terms arise due to leakage through the diode D1 and the capacitors C1 and C2; however, selecting the proper circuit components reduces the leakage errors. For example, the diode D1 can be selected to have a low reverse leakage, preferably less than 1 nano-Amp, and the capacitors C1 and C2 can also be a low-leakage type, preferably with a Teflon® or polystyrene dielectric. Such capacitors typically have an insulation resistance exceeding $10^{12}$ Ohms. Using such components the error due to leakage will be approximately 1 millivolt (mV) if the resistors R1 and R2 equal 500 KΩ. However, if the leakage error is assumed to be zero, then the voltage of the capacitor C1 or $V(C1)=V_{COMMON-MODE}$ and the voltage of the capacitor C2 or $V(C2)=V_{COMMON-MODE}+V_{UNKNOWN}$.

Figure 2:
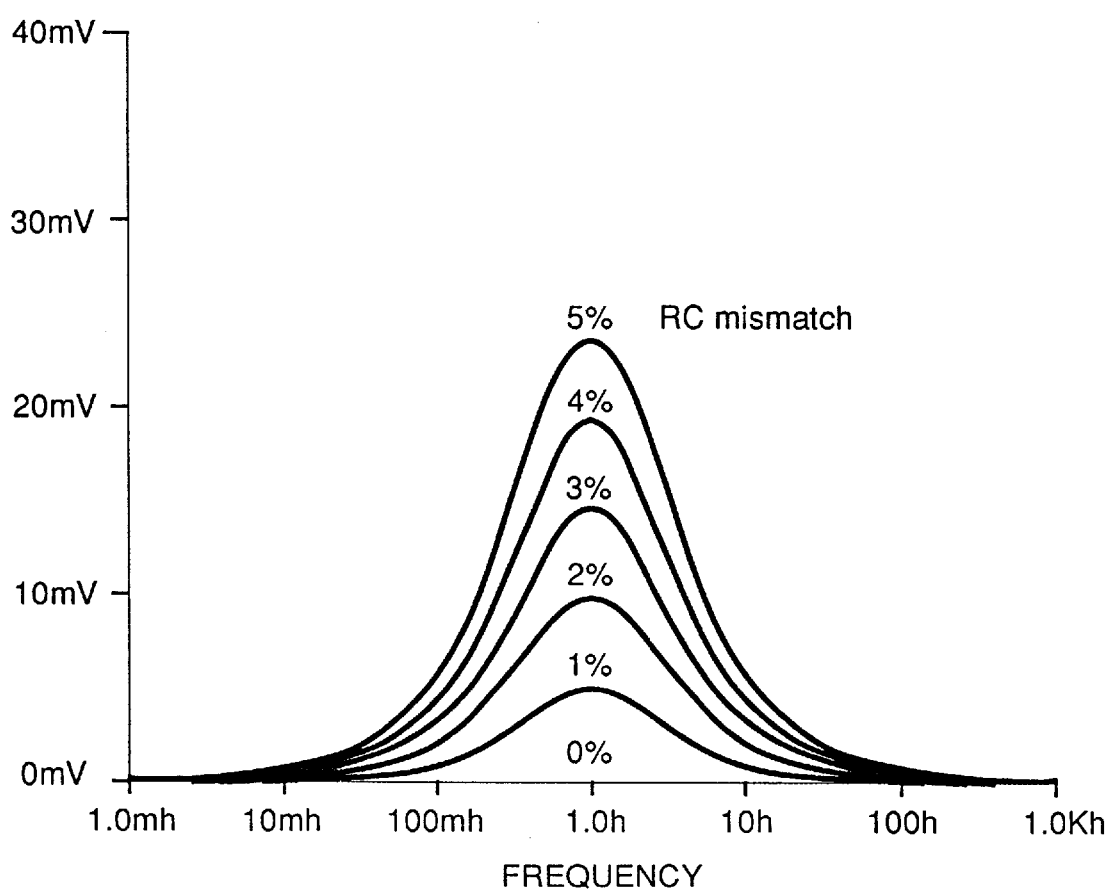
FIG. 2 is a graph showing the magnitude of a potential error source as a function of frequency and RC component parameters.

If $V_{COMMON-MODE}$ varies with time and the product (R1·C1) is equal to the product (R2·C2), then $V(C2)-V(C1)=V_{UNKNOWN}$ for any frequency or amplitude of $V_{COMMON-MODE}$. In practice, the RC products do not match exactly causing a mismatch error illustrated in FIG. 2. The mismatch error is significant only within a frequency range near the inverse of the RC product. The mismatch error becomes negligible at high and low frequencies and can be eliminated to a desired degree through closer matching, or by calibration.

As described above, $V(C2)-V(C1)=V_{UNKNOWN}$ plus or minus the mismatch error and the leakage errors, both of which can be reduced by selecting proper components or by precise component matching. The analysis below assumes that:

$$V_{UNKNOWN} = V(C2) - V(C1) \quad [1]$$

Figure 1:
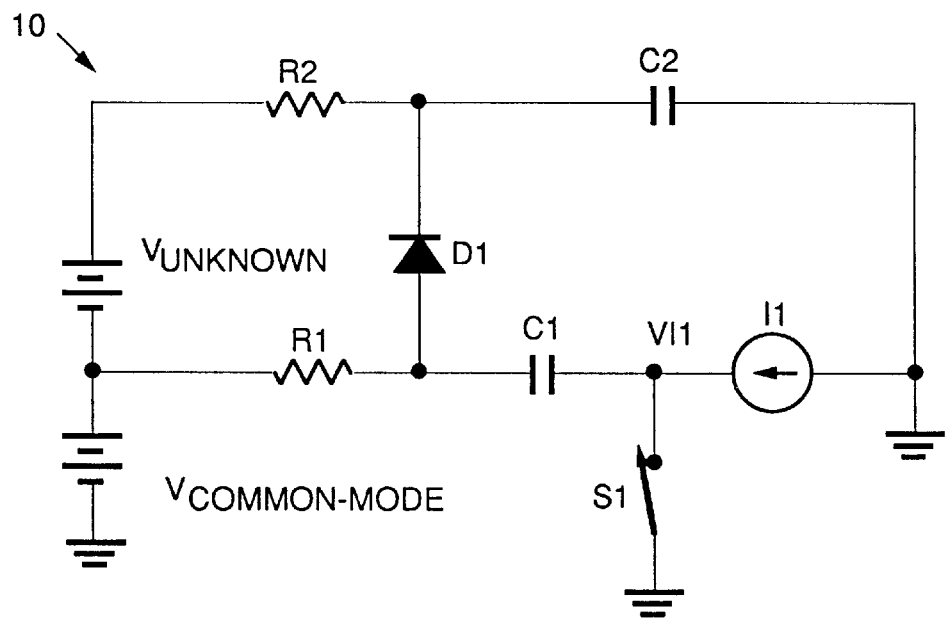
FIG. 1 is a simplified electrical schematic diagram useful in understanding the principle of operation of the present invention.

Referring to FIG. 1, the switch S1 is normally closed and is opened when a measurement is desired. Current flowing through the switch S1 to ground now flows through the capacitor C1, the diode D1, and the capacitor C2 to ground. Some current also flows through the resistors R1 and R2. Resistance values of the resistors R1 and R2 should be sufficiently high to direct most current through the capacitor C1, the diode D1, and the capacitor C2.

By Kirchhoff's Voltage Law, the sum of all voltages around any loop must equal zero. Therefore the following equation may be written for a loop including the current source I1, the capacitor C1, the diode D1, and the capacitor C2:

$$V_{I1}(t) + V_{C1}(t) - V_{D1}(t) - V_{C2}(t) = 0 \quad [2]$$

Substituting the standard formula for the voltage across a capacitor, $$V_c(t) = V_c(0) + \int_0^T \frac{i}{C} dt,$$

yields the following:

$$V_{I1}(t) + V_{C1}(0) - \int_0^T \frac{i}{C1} dt - V_{D1}(t) - V_{C2}(0) - \int_0^T \frac{i}{C2} dt = 0 \quad [3]$$

Note that the third term of equation [3] has a negative sign because current flows in opposition to the assumed polarity of the capacitor C1.

Gathering and rearranging terms, $$V_{I1}(t) = V_{C2}(0) - V_{C1}(0) + V_{D1}(t) + \left(\frac{1}{C2} + \frac{1}{C1}\right) \times \int_0^T i\, dt \quad [4]$$

Prior to opening switch S1, $V_{UNKNOWN} = V(C2) - V(C1)$ (see equation [1] above). Therefore $V_{C2}(0) - V_{C1}(0)$ may be replaced by $V_{UNKNOWN}$. During forward conduction a voltage drop of the diode D1 is not a function of time but is a function of the constant current flowing therethrough. Therefore the $V_{D1}(t)$ may be replaced by a constant $V_D$. Finally, since the current produced by the current source I1 is a constant, the equation [4] reduces to:

$$V_{I1}(t) = V_{UNKNOWN} + V_D + Kt, \text{ where } K = \left(\frac{C1 + C2}{C1\,C2}\right)i \quad [5]$$

From the equation [5] the voltage at the current source I1 includes three superimposed voltages: $V_{UNKNOWN}$, $V_D$ or the forward voltage drop of the diode, and a straight line voltage or Kt, the slope of which is controlled by component parameters. The voltage at the current source I1 is illustrated by waveform 11 in FIG. 3A. It is possible to recover $V_{UNKNOWN}$ from the waveform 11 through capacitive sampling, described further below. Advantageously, $V_{COMMON-MODE}$ is cancelled out during measurement thereby alleviating problems associated with applying a high voltage to semiconductor devices.

Figure 3A:
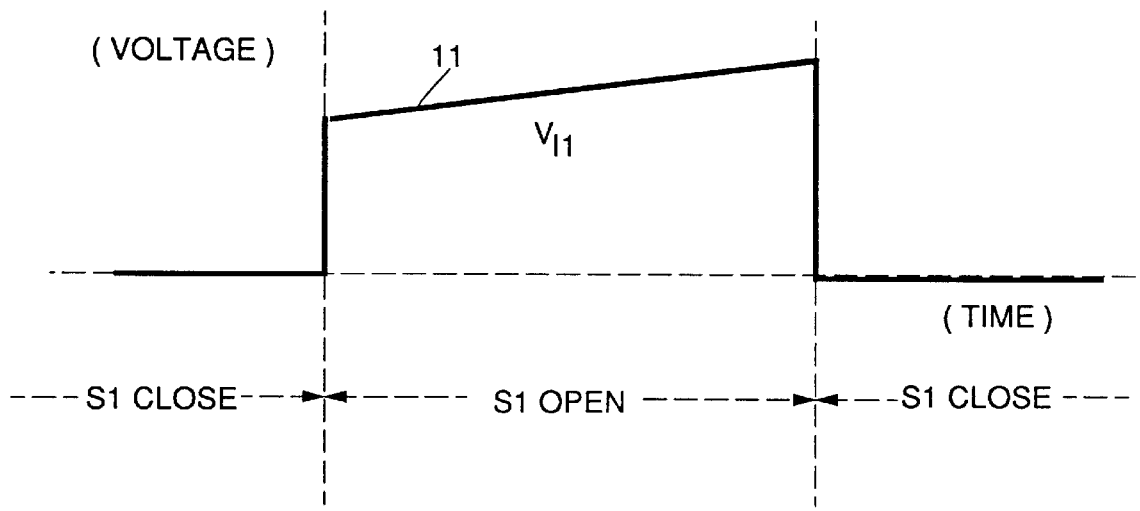
FIG. 3A is a waveform diagram illustrating a voltage waveform generated by the simplified electrometer of FIG. 1.

To extract the voltage of $V_{UNKNOWN}$ from the waveform 11 of FIG. 3A, three additional circuit elements can be used: first, a circuit for measuring the forward voltage drop of the diode D1; second, a circuit for precisely sampling and holding the voltage waveform 11 at one or more times (described below in conjunction with FIGS. 4 and 5); and third, a processing circuit for calculating an intercept by extrapolation of the slope of the waveform 11 (also described below in conjunction with FIGS. 4 and 5). The diode voltage drop is subtracted from the intercept to calculate $V_{UNKNOWN}$.

Figure 3B:
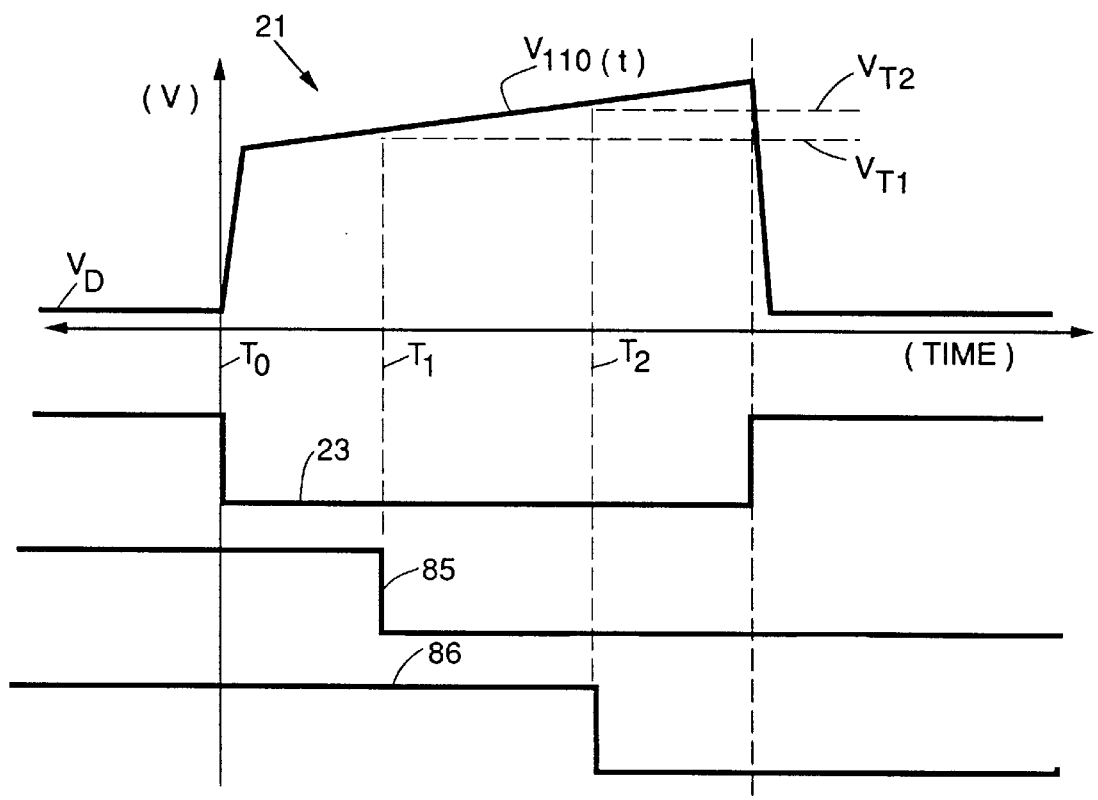
FIG. 3B is a waveform diagram illustrating several waveforms occurring during a measurement operation of the electrometer of FIG. 4.
Figure 4:
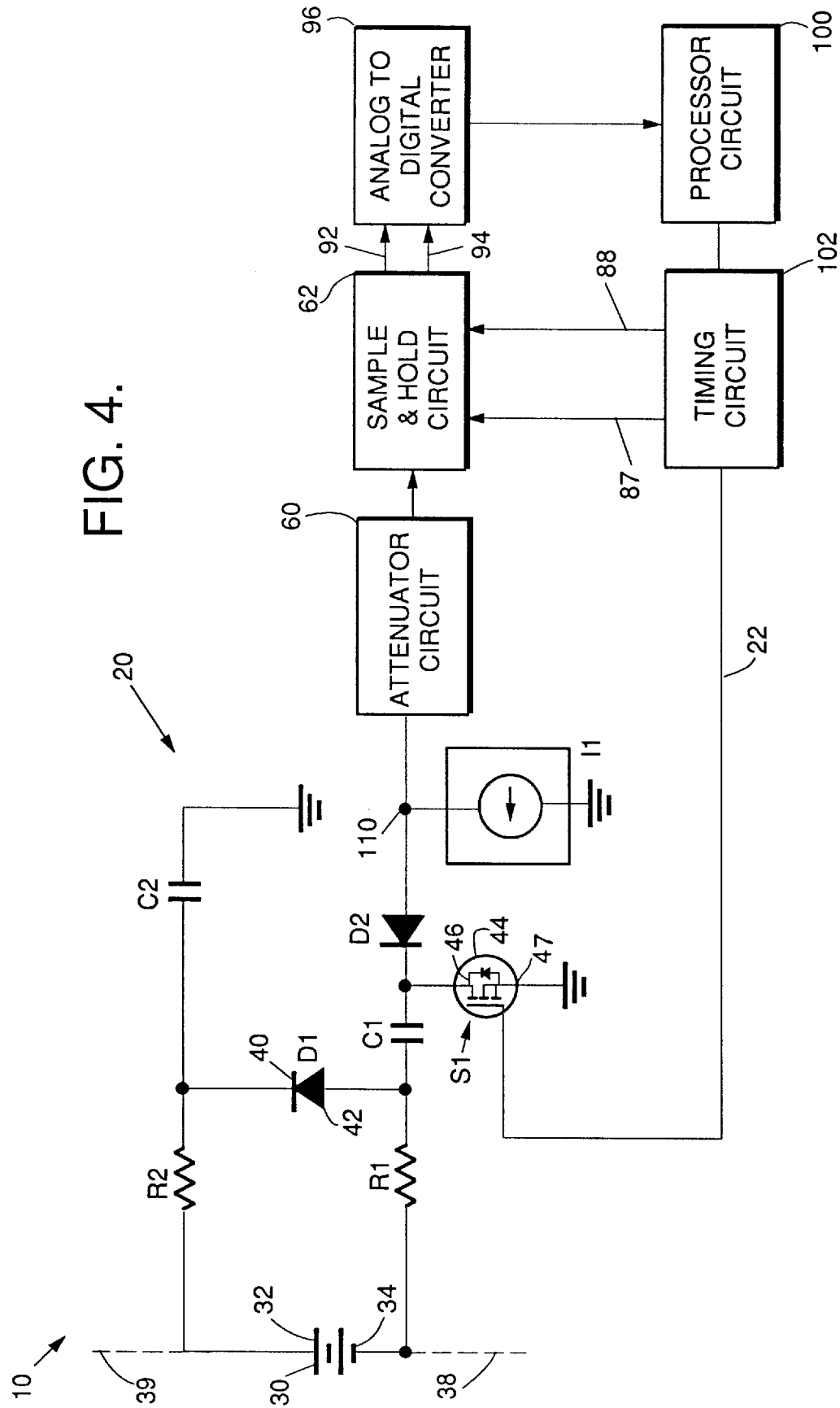
FIG. 4 is a diagram partially in schematic and partially in block form, of an electrometer made according to the present invention.

In FIG. 4, a sampled capacitor electrometer 20 according to the preferred embodiments of the present invention is shown. FIG. 3B illustrates a waveform 21 generated by the electrometer 20. For purposes of clarity, the same reference numbers and letters will be used as in FIG. 1 where appropriate.

The operation of the sampled capacitor electrometer 20 is as follows:

The voltage potential (or $V_{UNKNOWN}$) at 30 is the DC (direct current) voltage potential to be measured. Charge is directed from a more positive pole 32 of the voltage potential 30 through resistor R2 to capacitor C2. Charge is directed from a more negative pole 34 of the voltage potential 30 through the resistor R1 to the capacitor C1. The voltage potential 30 may be at any arbitrary common mode voltage ($V_{COMMON-MODE}$) relative to ground potential, as indicated by the dotted lines 38 and 39 extending from the two poles of the voltage potential 30. A cathode 40 of the sampling diode D1 is connected to a charged plate of the capacitor C2 and an anode 42 of the diode D1 is connected to a charged plate of capacitor C1.

A transistor 44 which can be an N-channel MOSFET, replaces the switch S1. A drain 46 of the transistor 44 is connected to a low-voltage plate of the capacitor C1 and a source 47 of the transistor 44 is connected to ground. A transistor control signal 23 (see FIG. 3B) on a conductor 22 generated by a timing circuit 102 controls the transistor 44. When the transistor control signal 23 is high, the transistor 44 conducts (corresponding to a closed switch) and when the transistor control signal 23 is low, the transistor 44 is off (corresponding to an open switch). The transistor 44 should have high speed, low capacitance and low resistance when turned on. The transistor 44 can be an MPF960 manufactured by Motorola, Inc.

A cathode of a calibration diode D2 is connected to the transistor 44 and an anode of the diode D2 is connected to the current source I1. All of the current from current source I1 flows through the diode D2.

As described above, the sampled capacitor electrometer 20 requires a circuit for measuring the forward voltage drop of the sampling diode D1. The calibration diode D2 performs this function. The sampling diode D1 and the calibration diode D2 form a matched pair of diodes. In the matched pair of diodes, both diodes exhibit the same forward voltage drop when operated at the same current and temperature. The matched diodes may be procured either as separate discrete components or as an integral package which is smaller and costs less to produce. Since the calibration diode D2 dissipates approximately 5 milliwatts (mW) due to forward conduction, and the sampling diode D1 dissipates much less than 5 mW, the temperature rise due to self-heating effects is essentially negligible. Therefore, the sampling diode D1 and the calibration diode D2 may be assumed to be at the same temperature. If the sampling diode D1 and the calibration diode D2 are separately packaged, they should be mounted in close proximity to each other.

During the sampling period, when the transistor 44 is turned off, the diodes D1 and D2 should have substantially the same current levels. Current which flows through the resistor R1 produces an error term which can be reduced by: (1) reducing the current flow through the resistor R1 by increasing the resistance value of the resistor R1; or, (2) increasing the current from the current source I1 to reduce variation of diode voltage with current (dV/dI).

If the sampling and the calibration diodes D1 and D2 are matched, and if the current source I1 is substantially constant, then the voltage drop of the sampling diode D1 under forward conduction can be inferred by measuring the forward voltage drop of the calibration diode D2 at any time. The calibration diode D2 is readily accessible and is connected to the sampling and the processing circuits described below. If the calibration diode D2 matches the sampling diode D1, separate calibration or measurement of either of the diodes D1 and D2 is unnecessary. Use of the calibration diode in conjunction with the sample and hold circuit (FIG. 4) allows accurate voltage measurement using the current source I1 which can have relatively low accuracy and temperature stability.

Figure 5:
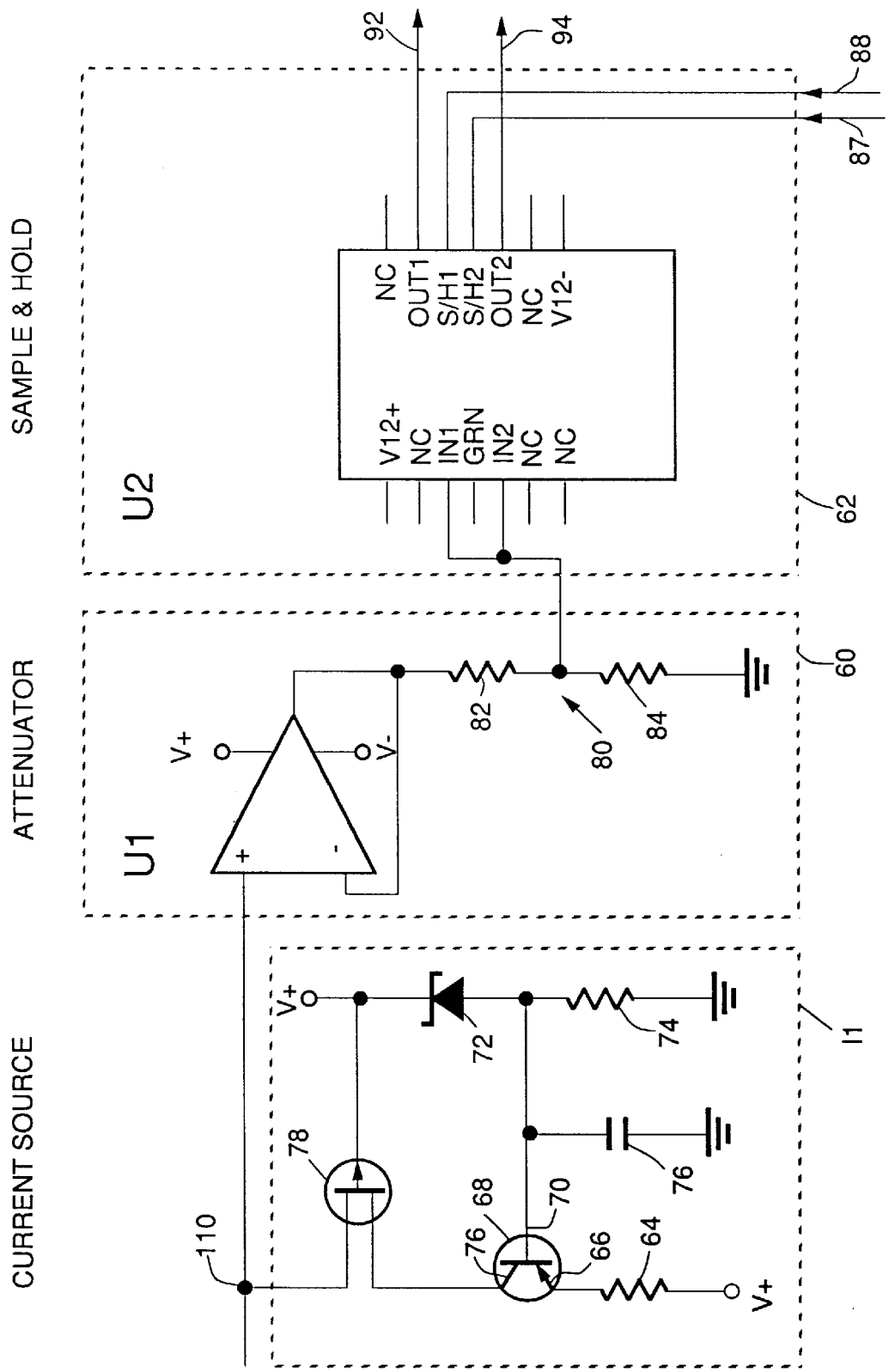
FIG. 5 is an electrical schematic diagram of the block diagrams of FIG. 4.

The current source I1, an attenuator circuit 60, and the sample and hold circuit 62 are shown in FIGS. 4 and 5 and are well known to those skilled in the art. Different implementations are contemplated.

Referring to FIG. 5, the current source I1 includes a resistor 64 connected to a positive voltage V+ which is of greater magnitude than $V_{UNKNOWN}$. The resistor 64 directs current into an emitter 66 of a transistor 68. A base 70 of the transistor 68 is clamped at a potential less than V+ by a zener diode 72, a resistor 74 and a capacitor 76. A constant current flows through from the resistor 64, the transistor 68 and a collector 76 of the transistor 68. Performance of the current source I1 is improved by a junction field-effect transistor (JFET) 78 in a cascade configuration. High frequency response is important to the transistor 78. The transistor 78 can be a J174 manufactured by Motorola, Inc. The current source I1 produces a substantially constant current and accuracy and temperature stability are of little concern.

The attenuator circuit 60 includes an operational amplifier (op-amp) U1 connected as a unity-gain follower. The op-amp U1 buffers an input signal into a resistive divider 80 including resistors 82 and 84. The attenuator circuit 60 is required if $V_{UNKNOWN}$ exceeds an input range of the sample-and-hold circuit 62. The op-amp U1 should have a settling time of less than 500 nanoseconds (ns) to 0.01%, and input offset voltage less than 1 millivolt (mV). The op-amp U1 can be an AD845 manufactured by Analog Devices, Inc. The resistors 82 and 84 should be precision resistors. A signal output of the attenuator circuit 60 is connected to the sample and hold circuit 62 which can be a single integrated circuit U2. The sample and hold circuit 62 includes two matched sample and hold amplifiers. Both inputs of the amplifiers are connected to the signal output (which varies with time) from the attenuator circuit 60. Control signals 85 and 86 (see FIG. 3B) on conductors 87 and 88, respectively, trigger a "hold" mode for each amplifier at different times. The corresponding "held" or sampled voltages are output via conductors 92 and 94 to an analog to digital converter circuit 96 (see FIG. 4).

The sample and hold circuit 62 should have a fast acquisition time of less than one microsecond ($\mu$s) to an accuracy of 0.01%, and a very low channel-to-channel aperture time difference of less than one nanosecond. The integrated sample and hold circuit U2 can be an AD682 manufactured by Analog Devices, Inc.

In FIG. 4, the sampled capacitor electrometer 20 is shown as including the dual-channel analog to digital converter circuit 96, a processor or computational circuit 100, and a timing circuit 102. Such circuits are well known to those skilled in the art and the exact descriptions are not important to this invention, except to note that circuits used must be capable of triggering the sample and hold circuit 62 and the transistor 44, reading the two sampled and held analog voltages on conductors 92 and 94, performing a computational operation on the two analog voltages, and computing a result, as taught herein.

The overall operation of the circuit may be explained as follows:

Referring to FIG. 1, prior to opening the switch S1 the voltage $V_{f1}$ was zero, and after opening the switch S1 the voltage was $V_{f1}(t)=V_{UNKNOWN}+V_D+Kt$. Referring to the sampled capacitor electrometer 20 in FIG. 4 (with the calibration diode D2), the voltage at node 110 or $V_{110}(t)$ is equal to $V_D$(also see FIG. 3B) when the transistor 44 is on (switch closed), and the voltage $V_{110}(t)=V_{UNKNOWN}+2V_D+Kt$ when transistor 44 is turned off (switch open). $V_{110}(t)$ with the transistor 44 off (switch open) is an equation of a straight line with slope K. $V_D$ is the forward drop of the diode D1 or the diode D2 if the diodes are matched.

In order to algebraically solve $V_{110}(t)$ (with the transistor 44 off) for the constant $V_{UNKNOWN}$, two points defining the straight line, and the value of $V_D$ are required.

Referring to FIG. 3B, the sampled waveform 21 (labeled $V_{110}(t)$) is shown along with the three control signals 23, 85, and 86 (on the conductors 22, 87, and 88) which are generated by the timing circuit 102. The voltage $V_D$ is measured by the processor circuit 100 prior to the time $T_0$. At time $T_0$, the timing circuit 102 generates the control signal 23 which turns off the transistor 44, causing the voltage signal at node 110 ($V_{110}(t)$) to rise up and follow the straight line equation. $V_{110}(t)$ is fed through the attenuator circuit 60 into the sample and hold circuit 62.

At time $T_1$ the control signal 85 on the conductor 87 is driven low by the timing circuit 102 causing the first channel of the sample-and-hold circuit 62 to hold the voltage $V_{110}$ (T1) as attenuated by the attenuation circuit 60. At time $T_2$, the timing circuit 102 generates the control signal 86 on the conductor 88 causing the second channel of the sample and hold circuit 62 to hold the voltage $V_{110}(T2)$, as attenuated by the attenuator circuit 60. As can be appreciated, the processor circuit 100 has now stored $V_D$, $V_{110}(T1)$, and $V_{110}(T2)$. The magnitude of time delays $(T_1-T_0)$ and $(T_2-T_1)$ are constants derived from the hardware and stored in the processor circuit 100.

Proceeding to solve for $V_{UNKNOWN}$:

$$V_{UNKNOWN} = V_{110}(0) - 2V_D \quad [6]$$

$$\text{where } V_{110}(0) = V_{110}(T_1) - \frac{V_{110}(T_2) - V_{110}(T_1)}{T_2 - T_1}(T_1 - T_0) \quad [7]$$

$$\therefore V_{UNKNOWN} = V_{110}(T_1) - \frac{V_{110}(T_2) - V_{110}(T_1)}{T_2 - T_1}(T_1 - T_0) - 2V_D \quad [8]$$

The right side of equation [8] contains only terms which have been measured and stored or programmed in memory in the processor circuit 100.

Calibration, if required, is achieved in software by a slight modification of the stored value of the delay time constant $(T_1-T_0)$. Referring to waveform 21 FIG. 3B, it is apparent that there is some particular value for the delay time constant $(T_1-T_0)$ which will produce the correct value for $V_{UNKNOWN}$ when solved per the equation [8] above. No calibration information is required regarding the current source, capacitors or diodes. As can be appreciated, calibration is simplified. Additionally, the sampled capacitor electrometer 20 of the present invention can easily be modified into a multi-channel voltage meter.

As can be appreciated, the electrometer disclosed herein can easily be interfaced with semiconductor devices without using electro-mechanical devices (e.g. relays) as with prior electrometers. Removing the electromechanical devices and otherwise simplifying the design decreases cost and increases the durability of the electrometer. In addition, the electrometer provides highly accurate measurement of unknown voltages in the presence of high $V_{COMMON-MODE}$ through a high source resistance.

Various other advantages of the present invention will become apparent to those skilled in the art after having the benefit of studying the foregoing text and drawings, taken in conjunction with the following claims.

What is claimed:

1. An electrometer for measuring an unknown direct current (DC) potential of a voltage source, said electrometer comprising:

a first capacitor connected to the unknown voltage source;

a second capacitor coupled to the unknown voltage source;

switch means for selectively applying a substantially constant current from a constant current source to the first capacitor;

a first resistor connected to a negative node of the unknown voltage source and the first resistor;

a second resistor connected to a positive node of the unknown voltage source and the second resistor;

a calibration diode having a cathode connected to the switch means and an anode connected to the constant current source;

sampling means for sampling the potential associated with the first capacitor at first and second time periods after the switch means has applied the current to the first capacitor; and processing means for generating an output related to the potential of the unknown voltage source as a function of the samples taken at the first and second time periods.

2. The electrometer of claim 1 further comprising a sampling diode having an anode connected to said first capacitor and said first resistor and a cathode connected to said second capacitor and said second resistor, wherein said sampling diode is reverse biased at substantially the potential of the unknown voltage source when the switch means does not apply current through said first capacitor, and which is forward biased when the switch means applies current to said first capacitor.

3. The electrometer of claim 1 wherein said switch means is positionable between an open mode and a closed mode, said closed mode preventing current from the current source from flowing through the first capacitor so that the first and second capacitors assume a potential difference related to the potential of the unknown voltage source.

4. The electrometer of claim 3 wherein said open mode permits current flow from the current source through the first capacitor, the sampling diode, and the second capacitor.

5. The electrometer of claim 1 wherein a processing means determines said potential of said unknown voltage source by sampling an anode voltage at said anode of said calibration diode at first and second time periods after said switch means applies current to said first capacitor.

6. The electrometer of claim 5 wherein said processing means determines said potential of said unknown voltage by calculating said anode voltage when said switch means applies current to said first capacitor and subtracting a forward drop of said sampling diode and said calibration diode.

7. The electrometer of claim 6 wherein said processing means extrapolates an intercept of said anode voltage using said samples at said first and second time periods.

8. An electrometer for measuring an unknown voltage potential having a positive pole and a negative pole, wherein one of said positive and negative poles is connected to a common mode voltage source having variable polarity, amplitude, and frequency, said electrometer comprising:

a first capacitor having one plate resistively coupled to the positive pole of the unknown potential;

a second capacitor having one plate resistively coupled to the negative pole of the unknown potential;

a first resistor which is connected to said positive pole of said unknown potential and said first capacitor;

a second resistor which is connected to said negative pole of said unknown potential and said second capacitor;

a sampling diode connected between the one plate of the first capacitor and the one plate of the second capacitor;

a substantially constant current source connected to an opposite plate of the second capacitor;

switch means for selectively connecting the output of the current source to ground;

sampling means for sampling the voltage waveform at the current source at first and second time periods after said switch means disconnects said current source from ground; and processing means for extrapolating an initial voltage of the voltage waveform immediately after said switch means disconnects the current source from ground using the samples taken at the first and second time periods.

9. The electrometer of claim 8 wherein said switch means is positionable between an open mode and a closed mode, said open mode disconnecting said current source from ground such that current from said current source flows through said second capacitor, through said sampling diode, and through said first capacitor.

10. The electrometer of claim 9 wherein said current source includes a voltage waveform related to the unknown potential plus a forward voltage drop of said sampling diode plus a time-dependant factor related to charging of the first and second capacitors.

11. The electrometer of claim 10 wherein said processing means computes said unknown potential from said forward voltage drop across said sampling diode and from said initial voltage of said voltage waveform.

12. The electrometer of claim 11 further including a calibration diode in series with the current source wherein said calibration diode is matched to the sampling diode and wherein the processing means estimates the forward voltage drop of the sampling diode from the forward voltage drop of the calibration diode.

* * * * *